United States Patent
Miura et al.

(10) Patent No.: US 8,197,053 B2
(45) Date of Patent: Jun. 12, 2012

(54) ACTIVE ENERGY BEAM-CURABLE INK AND INK-JET RECORDING METHOD USING ACTIVE ENERGY BEAM-CURABLE INK

(75) Inventors: Yuki Miura, Toyoake (JP); Akiko Noguchi, Kasugai (JP); Atsushi Naruse, Okazaki (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 382 days.

(21) Appl. No.: 12/568,700

(22) Filed: Sep. 29, 2009

(65) Prior Publication Data
US 2010/0079568 A1      Apr. 1, 2010

(30) Foreign Application Priority Data
Sep. 30, 2008   (JP) .................................. 2008-252640

(51) Int. Cl.
*B41J 2/01*     (2006.01)
*C08F 2/46*     (2006.01)

(52) U.S. Cl. ........................................ 347/102; 522/100
(58) Field of Classification Search ................ 347/9, 19, 347/21, 28, 45, 85, 96, 100, 102; 522/1, 522/4, 14, 21, 37, 75, 82, 84, 148, 168, 181
See application file for complete search history.

(56) References Cited

FOREIGN PATENT DOCUMENTS
JP       2002-317139       10/2002
JP       2002317139 A   *  10/2002
* cited by examiner

*Primary Examiner* — Stephen Meier
*Assistant Examiner* — Alexander C Witkowski
(74) *Attorney, Agent, or Firm* — Banner & Witcoff, Ltd.

(57) ABSTRACT

An active energy beam-curable ink contains an active energy beam-curable resin and a photocation polymerization initiator; wherein, as the active energy beam-curable resin, a multifunctional epoxy compound, an oxetane compound and 33 to 55% by weight of a monofunctional alicyclic epoxy compound are contained. Accordingly, it is possible to stably discharge the active energy beam-curable ink from an ink jet head, and the ink having a high hardness and high adhesion after curing is provided.

11 Claims, 2 Drawing Sheets

ACTIVE ENERGY BEAM-CURABLE INK AND INK-JET RECORDING METHOD USING ACTIVE ENERGY BEAM-CURABLE INK

CROSS REFERENCE TO RELATED APPLICATION

The present application claims priority from Japanese Patent Application No. 2008-252640, filed on Sep. 30, 2008, the disclosure of which is incorporated herein by reference in its entirety.

BACKGROUND OF THE INVENTION

1. Field of the Invention

The present invention relates to an active energy beam-curable ink which is curable by being irradiated with, for example, the ultraviolet light and which is preferably applicable to the ink-jet recording system, and an ink jet recording method using the active energy beam-curable ink.

2. Description of the Related Art

Conventionally, an active energy beam-curable composition, which is curable by being irradiated with the active energy beam such as the ultraviolet light or the like, is used for the ink for a printer for screen printing. Such an active energy beam-curable composition is excellent in the curing speed, because any dilution solvent is not used. In particular, such an active energy beam-curable composition is suitable to perform the coating printing, for example, on metal and plastic.

However, the technique for the printer of the ink jet recording system has been improved in recent years. In accordance with this, the demand is gradually increased to perform the coating printing by using the printer of the ink-jet recording system, for example, on the metal and the plastic as well, instead of the printer for the screen printing. In this case, it is also conceived that the active energy beam-curable composition as described above is used as the ink. However, a problem arises such that the viscosity is high, and hence the ink is not stably discharged from the printer head. In order to solve this problem, it is also conceived that the ink is diluted with a solvent to decrease the viscosity. However, a problem arises such that the curing speed is inferior when the ink is diluted with the solvent, which is not preferred in view of the printing characteristic.

On the other hand, Japanese Patent Application Laid-open No. 2002-317139 describes an active energy beam-curable ink containing an alicyclic epoxy resin, an oxetane compound, a cationic polymerization initiator, and a coloring agent. This composition is excellent in the hardness, the curing speed, and the bendability of the cured coating film; and it is affirmed that the composition is usable, for example, for the printing ink.

However, when the active energy beam-curable ink described in Japanese Patent Application Laid-open No. 2002-317139 is used as the ink for the ink-jet recording system, the viscosity is extremely important. If the viscosity is high, the ink is not smoothly jetted from the ink jet nozzle. If the viscosity is low, then the liquid drips from the nozzle to cause the dirt or stain and the leakage thereby. In a case that an active energy beam-curable ink sought for by the present inventors is to be used for the ink-jet, those required include the adhesion or adhesion degree of the cured film of the active energy beam-curable ink with respect to the recording medium and the hardness of the cured film of the active energy beam-curable ink in addition to the viscosity described above. It is necessary to adjust the relationship among them. However, the active energy beam-curable ink described in Japanese Patent Application Laid-open No. 2002-317139 does not necessarily fulfill the three factors as described above.

SUMMARY OF THE INVENTION

The present invention is directed to solve the various problems as described above, an object of which is to provide an active energy beam-curable ink which is usable as an ink for the ink jet recording system and which is excellent in the hardness of a cured film after being cured and in the adhesion with respect to a recording medium.

In order to achieve the object as described above, according to a first aspect of the present invention, there is provided an active energy beam-curable ink containing: a photocation polymerization initiator; and a multifunctional epoxy compound, an oxetane compound, and a monofunctional alicyclic epoxy compound as an active energy beam-curable resin; wherein a content of the monofunctional alicyclic epoxy compound is 33 to 55% by weight.

Since the active energy beam-curable ink of the present invention contains, as the active energy beam-curable resin, the monofunctional alicyclic epoxy compound in addition to the multifunctional epoxy compound and the oxetane compound, it is possible to obtain the active energy beam-curable ink which is suitable for the ink-jet recording system. Further, by making the content of the monofunctional alicyclic epoxy compound be not more than 55% by weight, it is possible to make the multifunctional epoxy compound and the oxetane compound be contained in sufficient amounts. Accordingly, it is possible to obtain the active energy beam-curable ink which has high hardness and high adhesion degree.

According to a second aspect of the present invention, there is provided an ink-jet recording method including: discharging the active energy beam-curable ink of the first aspect to a recording medium; and irradiating the discharged active energy beam-curable ink with an active energy beam to cure the active energy beam-curable ink.

With the ink-jet recording method of the present invention, it is possible to adhere, to the recording medium, the cured film of the active energy beam-curable ink having the high hardness and the high adhesion degree.

DESCRIPTION OF THE PREFERRED EMBODIMENTS

Figure 1:
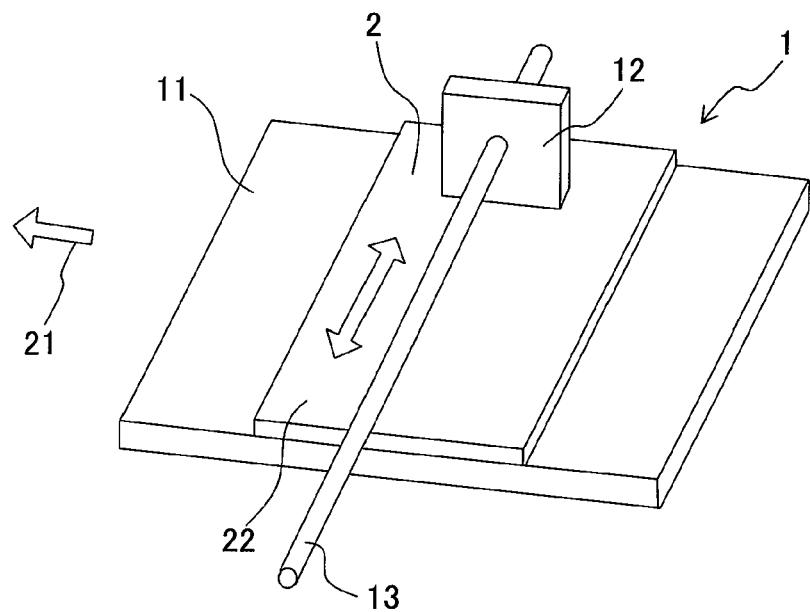
FIG. 1 schematically shows an exemplary ink-jet recording apparatus which performs the printing with the active energy beam-curable ink according to the present invention.

The active energy beam-curable ink according to the present invention will be explained below.

The active energy beam-curable ink according to the present invention is the active energy beam-curable ink containing the active energy beam-curable resin and the photocation polymerization initiator, wherein the active energy beam-curable ink contains, as the active energy beam-curable resin, the multifunctional epoxy compound and the oxetane compound, and the active energy beam-curable ink further contains 33 to 55% by weight of the monofunctional alicyclic epoxy compound. These substances will be explained below.

The multifunctional epoxy compound to be used in the present invention includes, for example, multifunctional aliphatic epoxy compounds and multifunctional alicyclic epoxy compounds.

The multifunctional aliphatic epoxy compound may include, for example, bisphenol A type epoxy compounds, bisphenol F type epoxy compounds, alkylphenol novolak type epoxy compounds such as phenol novolak type epoxy compounds, cresol novolak type epoxy compounds, and p-tert-butylphenol novolak type epoxy compounds, hydrogenated bisphenol A type epoxy compounds, bisphenol A alkylene oxide diglycidyl ether, bisphenol F alkylene oxide diglycidyl ether, hydrogenated bisphenol A alkylene oxide diglycidyl ether, tetrabromobisphenol A type epoxy compounds, ethylene glycol diglycidyl ether, propylene glycol diglycidyl ether, neopentyl glycol diglycidyl ether, butanediol diglycidyl ether, hexanediol diglycidyl ether, cyclohexane dimethanol diglycidyl ether, polyethylene glycol diglycidyl ether, polypropylene glycol diglycidyl ether, trimethylolpropane diglycidyl ether, trimethylolpropane triglycidyl ether, pentaerythritol triglycidyl ether, pentaerythritol tetraglycidyl ether, sorbitol heptaglycidyl ether, sorbitol hexaglycidyl ether, resorcin diglycidyl ether, dicyclopentadiene/phenol addition type glycidyl ether, methylenebis(2,7-dihydroxynaphthalene) tetraglycidyl ether, 1,6-dihydroxynaphthalene diglycidyl ether, 1,5-dihydroxynaphthalene diglycidyl ether, and trimethylolpropane polyglycidyl ether such as trimethylolpropane diglycidyl ether, trimethylolpropane triglycidyl ether or a mixture of trimethylolpropane diglycidyl ether and trimethylolpropane triglycidyl ether (for example, Denacol EX-321L produced by Nagase ChemteX Corporation), etc.

The multifunctional alicyclic epoxy compound includes, for example, 3,4-epoxycyclohexylmethyl-3,4-epoxycyclohexane carboxylate (for example, Celloxide 2021P, produced by Daicel Chemical Industries, Ltd.), epoxide of ester of tetrahydrophthalic acid and tetrahydrobenzyl alcohol and ε-caprolactone adduct thereof (for example, Epolead GT301, GT401, produced by Daicel Chemical Industries, Ltd.), 1,2-epoxy-4-(2-oxylanyl)cyclohexene adduct of 2,2-bis(hydroxymethyl)-1-butanol (for example, EHPE 3150, produced by Daicel Chemical Industries, Ltd.).

Among the multifunctional epoxy compounds described above, it is preferable to use the multifunctional alicyclic epoxy compound in consideration of the curing speed or velocity.

The oxetane compound to be used in the present invention refers to compounds of four-membered ethers. The oxetane compound is not specifically limited provided that the compound has at least one oxetane ring in the molecule. Specified examples of the compound having one oxetane ring include, for example, 3-ethyl-3-hydroxymethyloxetane (for example, Aron Oxetane OXT-101, produced by Toagosei Co., Ltd.), 3-(meta)allyloxymethyl-3-ethyloxetane, 3-ethyl-3-(cyclohexyloxy)methyloxetane (for example, Aron Oxetane OXT-213, produced by Toagosei Co., Ltd.), 3-ethyl-3-(2-ethylcyclohexyloxymethyl)oxetane (for example, Aron Oxetane OXT-212, produced by Toagosei Co., Ltd.), (3-ethyl-3-oxetanylmethoxy)methylbenzene, 3-ethyl-3-(phenoxymethyl)oxetane (for example, Aron Oxetane OXT-211, produced by Toagosei Co., Ltd.), 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl) ether, 2-ethylhexyl(3-ethyl-3-oxetanylmethyl)ether, ethyldiethylene glycol (3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl (3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl) ether, pentachlorophenyl(3-ethyl-3-oxetanylmethyl)ether, pentabromophenyl(3-ethyl-3-oxetanylmethyl)ether, and bornyl(3-ethyl-3-oxetanylmethyl) ether. Specified examples of the compound having two or more oxetane rings include, for example, 3,7-bis(3-oxetanyl)-5-oxa-nonane, 3,3'-(1,3-(2-methylenyl)propanediylbis(oxymethylene))bis-(3-ethyloxetane), bis[1-ethyl(3-oxetanyl)]methyl ether, 1,4-bis[(3-ethyl-3-oxetanylmethoxy)methyl]benzene (for example, Aron Oxetane OXT-121, produced by Toagosei Co., Ltd.), 3-ethyl-3-{[(3-ethyloxetanyl)methoxy]methyl}oxetane (for example, Aron Oxetane OXT-221, produced by Toagosei Co., Ltd.), 1,3-bis[(3-ethyloxetane-3-yl)methoxy]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenylbis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl) ether, dipentaerythritol pentakis(3-ethyl-3-oxetanylmethyl)ether, dipentaerythritol tetrakis(3-ethyl-3-oxetanylmethyl)ether, caprolactone modified dipentaerythritol hexakis(3-ethyl-3-oxetanylmethyl)ether, caprolactone modified dipentaerythritol pentakis(3-ethyl-3-oxetanylmethyl)ether, ditrimethylolpropane tetrakis(3-ethyl-3-oxetanylmethyl)ether, EO modified bisphenol A bis(3-ethyl-3-oxetanylmethyl)ether, PO modified bisphenol A bis (3-ethyl-3-oxetanylmethyl)ether, EO modified hydrogenated bisphenol A bis(3-ethyl-3-oxetanylmethyl)ether, PO modified hydrogenated bisphenol A bis(3-ethyl-3-oxetanylmethyl)ether, EO modified bisphenol F bis(3-ethyl-3-oxetanylmethyl)ether, oxetanyl silsesquioxane, oxetanyl silicate, and phenol novolak oxetane. One species of the oxetane compound as described above may be used singly. Alternatively, two or more species of the oxetane compounds as described above may be used in combination.

Specified examples of the monofunctional alicyclic epoxy compound to be used in the present invention include, for example, 4-vinylepoxycyclohexane (for example, Celloxide 2000, produced by Daicel Chemical Industries, Ltd.). The monofunctional alicyclic epoxy compound is blended in an amount of 33 to 55% by weight in the active energy beam-curable ink of the present invention. It is desirable that the viscosity of the monofunctional alicyclic epoxy compound is not more than 5 cps in order to realize stable discharge (jetting) by the ink jet recording system using an ink jet head. Needless to say, the monofunctional alicyclic epoxy compound is not limited to 4-vinylepoxycyclohexane provided that the active energy beam-curable ink has a viscosity of not more than 10 cps. The active energy beam-curable ink having the viscosity of not more than 10 cps is suitable for the printing with the ink-jet system.

The photocation polymerization initiator to be used in the present invention refers to the compound capable of releasing or liberating a substance which starts the cationic polymerization by being irradiated with the active energy beam. The photocation polymerization initiator is especially preferably an onium salt in which the acid is produced by being irradiated with the light. Such a substance includes, for example, diazonium salts, iodonium salts, and sulfonium salts which are onium salts wherein cationic portions or moieties thereof are aromatic diazonium, aromatic iodonium, and aromatic sulfonium respectively, and anionic portions or moieties thereof are composed of, for example, $BF_4^-$, $PF_6^-$, $SbF_6^-$, or $[BX_4]^-$ provided that X represents the phenyl group substituted with two or more fluorine atoms or trifluoromethyl groups. More specified examples include, for example, aryldiazonium salt of tetrafluoroboron, triarylsulfonium salt of hexafluorophosphorus, diaryliodonium salt of hexafluorophosphorus, triarylphosphonium salt of hexafluoroantimony, diaryliodonium salt of hexafluoroantimony, tri-4-methylphenylsulphonium salt of hexafluoroarsenic, tri-4-methylphenylsulphonium salt of tetrafluoroantimony, tetrakis(pentafluorophenyl)borate triarylsulfonium salt, tetrakis(pentafluorophenyl)borate diaryliodonium salt, mixture of acetylacetone aluminum salt and ortho-nitrobenzyl silyl ether, phenylthiopyridium salt, and hexafluorophosphorus allene-iron complex. Specified examples of the onium salt include, for example, Optomer SP-150, Optomer SP-170 (produced by Asahi Denka Co., Ltd.), UVI-6992 (produced by Dow Chemical Company), CPI-100P, CPI-100A (produced by SAN-APRO Ltd.), TEPBI-S (produced by Nippon Shokubai Co., Ltd.), and Rhodorsil 2074 (produced by Rhodia). One species of them may be used singly, or two or more species of them may be used in combination. Among them, it is preferable to use the initiator of the sulfonium salt or the iodonium salt with which the cured film slightly suffers the coloring. It is more preferable to use the iodonium salt in view of the curing property or the curing performance.

It is also possible to use a photosensitizer including, for example, benzophenone, benzoisopropyl ether, thioxanthone, anthracene, and derivatives of these compounds together with the photocation polymerization initiator in combination. Specified examples thereof include, for example, 4,4'-bis(diethylamino)benzophenone, 2,4'-diethylthioxanthone, isopropylthioxanthone, 9,10-diethoxyanthracene, and 9,10-dibutoxyanthracene. The content of the photocation polymerization initiator is preferably 0.1 to 20% by weight and more preferably 0.2 to 15% by weight. In view of the productivity, it is desirable that the initiator is not used in any excessive amount. If the initiator is used in any excessive amount, then the light beam transmittance is lowered, the curing of the film bottom portion is insufficient, and the corrosion is strengthened in some cases. If the amount of the initiator is too small, then the amount of the active cationic substance to be generated or produced by being irradiated with the active energy beam is insufficient, and any sufficient curing property or curing performance is not obtained in some cases.

A coloring agent may be added to the active energy beam-curable ink according to the present invention. Those usable as the coloring agent include pigments and dyes. One type of the pigment or the dye may be used, or a plurality of types of the pigments or the dyes may be used simultaneously. Further, the pigment or pigments and the dye or dyes may be used simultaneously. Those usable as the pigment include organic pigments such as monoazo pigments, disazo pigments, azo lake pigments, quinacridone pigments, perylene pigments, anthrapyrimidine pigments, isoindolinone pigments, threne or indanthrene pigments, phthalocyanine pigments and the like; and inorganic pigments such as carbon black, chrome yellow, Bengala, titanium oxide, molybdenum red, cadmium red, cobalt blue, chrome green and the like. Those usable as the dye include dyes such as xanthen dyes, coumarin dyes, merocyanine dyes, carbocyanine dyes, stylyl dyes, thiadine dyes, adine dyes, methine dyes, oxadine dyes, phenylmethane dyes, cyanine dyes, azo dyes, anthraquinone dyes, pyrazoline dyes, stilbene dyes, quinoline dyes, leuco dyes and the like.

The active energy beam, which is usable to cure the active energy beam-curable ink of the present invention, may be those which decompose the photocation polymerization initiator to generate or produce the proton or the carbonium ion (carbocation). The active energy beam includes the electromagnetic wave such as the ultraviolet light, the X-ray, the gamma-ray and the like. In particular, it is preferable to use the ultraviolet light-curable ink in view of, for example, the wavelength absorption performance of the photocation polymerization initiator, and the versatility of the resin to be used and the radiation apparatus. In this case, it is possible to preferably use, for example, a high voltage mercury lamp, a metal halide lamp, a xenon lamp and an LED lamp as the light source.

The active energy beam-curable ink of the present invention is blended by sufficiently agitating the active energy beam-curable resin, the photocation polymerization initiator, and optionally the coloring agent and other additive(s). When the pigment is used as the coloring agent, the pigment is distinctly or separately dispersed in a dispersion medium (to use the active energy beam-curable resin), for example, by a ball mill or a bead mill to prepare a mill base. The mill base is mixed with the other substances, followed by being agitated to obtain the active energy beam-curable ink. It is desirable that the prepared ink is filtrated through a filter of about 2 μm. In the operation as described above, it is necessary that the apparatus to be used should be placed in an environment such as a dark room or the like in which the active energy beam is absent, in order to prevent the ink from being cured during the operation.

It is desirable that the viscosity of the active energy beam-curable ink of the present invention is not more than 10 cps in consideration of the application to the printer head of the ink jet system. If the viscosity is above 10 cps, it is difficult to stably discharge the ink unless any special artifice such as a heating apparatus or the like is applied to the printer head of the ink-jet system.

EXAMPLES

Examples of the present invention will be explained below. However, the present invention is not limited to Examples.

Preparation of Ink

Respective components shown in Tables 1 and 2 were collected in a vessel at predetermined ratios in a dark room, followed by being agitated and then filtrated through a Polyflon filter having a pore size of 2 μm to prepare inks of Examples and Comparative Examples respectively. Those shown in Table 1 are those of Examples and Comparative Examples each containing no coloring agent. Those shown in Table 2 are those of Examples and Comparative Examples each containing the coloring agent. Table 3 shows a list of manufacturers of the respective substances shown in Tables 1 and 2. As for the inks added with the pigment as the coloring agent, the oxetane compound (OXT-213), the quinacridone pigment, and the pigment dispersing agent (Solsperse) were collected at the following ratios, and then the pigment was dispersed by a bead mill. After that, the respective materials were collected in the vessel to give the ratios shown in Table 2, and the agitation was performed.

Oxetane compound (OXT-213): 60% by weight
Quinacridone pigment: 25% by weight
Pigment dispersing agent (Solsperse): 15% by weight Among the used substances, Celloxide 2000 as the monofunctional alicyclic epoxy compound had a viscosity of 1.7 cps. The viscosity was measured by a Brookfield viscometer DV-II+ wherein a cylindrical spindle was used while adjusting the number of revolutions so that the rotational torque was 20 to 30% in an environment of a temperature of 25° C. with a sample amount of 16 ml.

TABLE 1

|   |   | Example |   |   |   |   | Comparative Example |   |
|---|---|---|---|---|---|---|---|---|
|   |   | 1 | 2 | 3 | 4 | 5 | 1 | 2 |
| Multifunctional epoxy compound | Celloxide 2021P | 43.3 | 40 | 33.3 |   | 40 | 40 | 46.7 |
|   | Denacol EX-321L |   |   |   | 40 |   |   |   |
|   | Celloxide 3000 |   |   |   |   |   |   |   |
| Oxetane compound | OXT-213 | 21.7 | 20 | 16.7 | 20 |   | 60 | 23.3 |
|   | OXT-221 |   |   |   |   | 20 |   |   |
|   | OXT-211 |   |   |   |   |   |   |   |
| Monofunctional alicyclic epoxy compound | Celloxide 2000 | 35 | 40 | 50 | 40 | 40 |   | 30 |
| Vinyl ether | DVE-3 |   |   |   |   |   |   |   |
|   | DVE-2 |   |   |   |   |   |   |   |
| Monofunctional aliphatic epoxy compound | EX-111 |   |   |   |   |   |   |   |
|   | EX-121 |   |   |   |   |   |   |   |
| Photocation polymerization initiator | UVI-6992 | 6 | 6 | 6 | 6 | 6 | 6 | 6 |
| Viscosity | [cps] | 9.4 | 8.2 | 5.9 | 8.7 | 9.1 | 21 | 11.2 |
| Hardness |   | + | + | + | + | + |   | + |
| Adhesion |   | + | + | + | + | + | ± | + |
| Ink-jet discharge stability |   | + | + | + | + | + | − | ± |

|   |   | Comparative Example |   |   |   |
|---|---|---|---|---|---|
|   |   | 3 | 4 | 5 | 6 |
| Multifunctional epoxy compound | Celloxide 2021P | 26.7 | 30 | 40 | 40 |
|   | Denacol EX-321L |   |   |   |   |
|   | Celloxide 3000 |   |   |   |   |
| Oxetane compound | OXT-213 | 13.3 | 10 | 10 | 20 |
|   | OXT-221 |   |   |   |   |
|   | OXT-211 |   |   |   |   |
| Monofunctional alicyclic epoxy compound | Celloxide 2000 | 60 | 70 |   |   |
| Vinyl ether | DVE-3 |   |   | 50 |   |
|   | DVE-2 |   |   |   | 40 |
| Monofunctional aliphatic epoxy compound | EX-111 |   |   |   |   |
|   | EX-121 |   |   |   |   |
| Photocation polymerization initiator | UVI-6992 | 6 | 6 | 6 | 6 |
| Viscosity | [cps] | 4.5 | 3.5 | 11 | 8.5 |
| Hardness |   | ± | − |   |   |
| Adhesion |   | + | − | ± | ± |
| Ink-jet discharge stability |   | + | + | ± | + |

|   |   | Comparative Example |   |   |   |
|---|---|---|---|---|---|
|   |   | 7 | 8 | 9 | 10 |
| Multifunctional epoxy compound | Celloxide 2021P | 40 | 40 | 15.8 |   |
|   | Denacol EX-321L |   |   |   |   |
|   | Celloxide 3000 |   |   |   | 50 |
| Oxetane compound | OXT-213 | 40 | 10 |   |   |
|   | OXT-221 |   |   |   | 50 |
|   | OXT-211 |   |   | 84.2 |   |

TABLE 1-continued

| | | | | | |
|---|---|---|---|---|---|
| Monofunctional alicyclic epoxy compound | Celloxide 2000 | | | | |
| Vinyl ether | DVE-3 DVE-2 | | | | |
| Monofunctional aliphatic epoxy compound | EX-111 EX-121 | 20 | 50 | | |
| Photocation polymerization initiator | UVI-6992 | 6 | 6 | 6 | 6 |
| Viscosity [cps] | | 9.2 | 9.2 | 21.2 | 9.8 |
| Hardness | | | | + | ± |
| Adhesion | | ± | ± | + | + |
| Ink-jet discharge stability | | + | + | − | + |

TABLE 2

| | | Example | | Comparative Example | |
|---|---|---|---|---|---|
| | | 6 | 7 | 11 | 12 |
| Multifunctional epoxy compound | Celloxide 2021P | 40 | 33.3 | 46.7 | 26.7 |
| Oxetane compound | OXT-213 | 20 | 16.7 | 23.3 | 13.3 |
| Monofunctional alicyclic epoxy compound | Celloxide 2000 | 40 | 50 | 30 | 60 |
| Photocation polymerization initiator | UVI-6992 | 6 | 6 | 6 | 6 |
| Pigment | Quinacridone pigment | 2 | 2 | 2 | 2 |
| Pigment dispersing agent | Solsperse | 1.3 | 1.3 | 1.3 | 1.3 |
| Viscosity [cps] | | 9 | 7.1 | 13.6 | 5.4 |
| Hardness | | + | + | + | − |
| Adhesion | | + | + | + | + |
| Ink-jet discharge stability | | + | + | ± | + |

TABLE 3

| Type of compound | Name | Manufacturer |
|---|---|---|
| Multifunctional epoxy compound | Celloxide 2021P | Daicel Chemical Industries, Ltd. |
| | Denacol EX-321L | Nagase ChemteX Corporation |
| | Celloxide 3000 | Daicel Chemical Industries, Ltd. |
| Oxetane compound | OXT-213 | Toagosei Co., Ltd. |
| | OXT-221 | Toagosei Co., Ltd. |
| | OXT-211 | Toagosei Co., Ltd. |
| Monofunctional alicyclic epoxy compound | Celloxide 2000 | Daicel Chemical Industries, Ltd. |
| Vinyl ether | Rapi-Cure DVE-3 | ISP Japan |
| | Rapi-Cure DVE-2 | ISP Japan |
| Monofunctional aliphatic epoxy compound | EX-111 | Nagase ChemteX Corporation |
| | EX-121 | Nagase ChemteX Corporation |
| Photocation polymerization initiator | UVI-6992 | Dow Chemical Company |
| Pigment | Quinacridone pigment | — |
| Pigment dispersing agent | Solsperse | Lubrizol |

Printing with Ink

The inks, which were prepared to have the compositions shown in Tables 1 and 2, were subjected to the printing on the recording medium by an ink jet recording apparatus using a piezo-type ink jet head as shown in FIG. 1. In this embodiment, a PET film was used for the recording medium. The ink jet recording apparatus shown in FIG. 1 discharges the active energy beam-curable ink of the present invention from an ink-jet head 12 toward a recording medium 2 placed on a recording medium support base 11. During this process, the recording medium support base 11 is moved in a direction of an arrow 21 by an unillustrated motor unit. Further, the ink jet head 12 reciprocated (moved reciprocatively) in directions of an arrow 22 on a slide rail 13 in accordance with operation of an unillustrated motor unit, etc. Accordingly, the active energy beam-curable ink of the present invention can be subjected to the printing on any arbitrary position on the surface of the recording medium 2.

Curing of Ink Subjected to Printing

Figure 2:
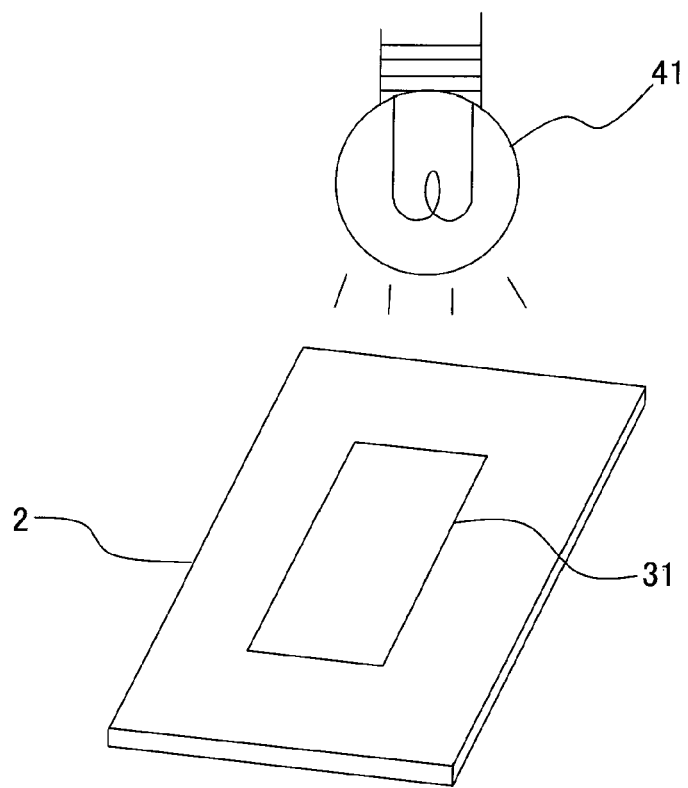
FIG. 2 schematically shows an ultraviolet radiation apparatus which cures the active energy beam-curable ink according to the present invention printed on a recording medium.
Figure 3:
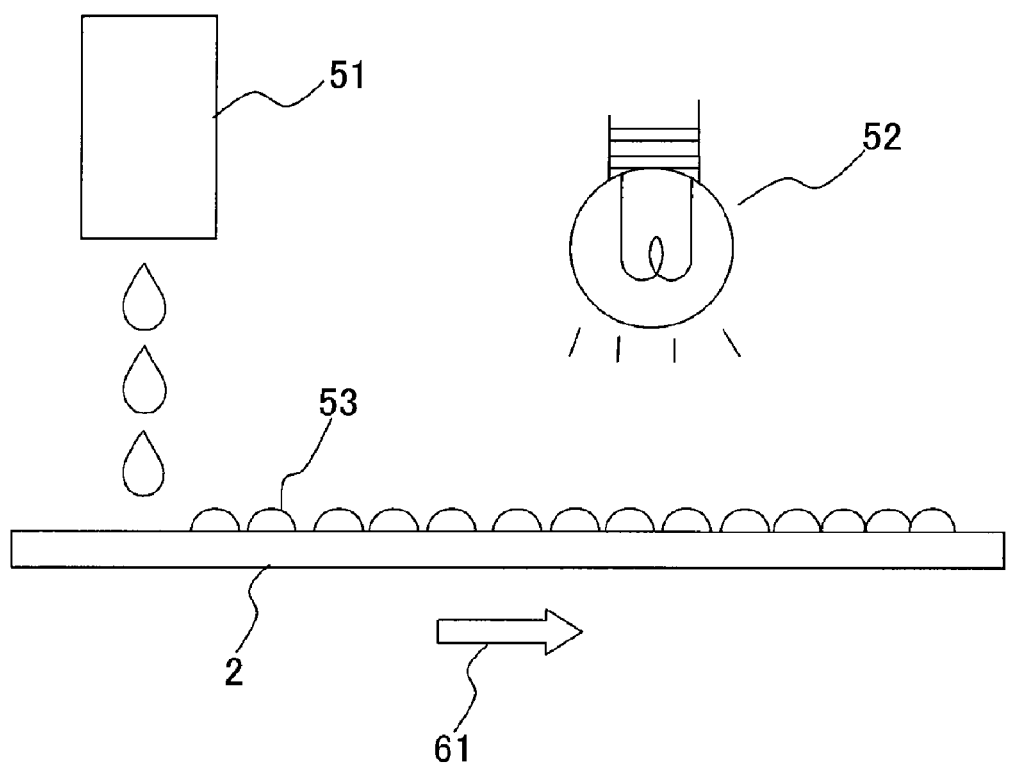
FIG. 3 schematically shows a situation wherein the active energy beam-curable ink according to the present invention, which is discharged by the ink-jet recording apparatus and which is adhered on a recording medium, is cured by an ultraviolet radiation apparatus.

The PET film, which has been subjected to the printing with the ink, is irradiated with the ultraviolet light, and thus the ink on the recording medium 2 is cured. The curing method includes, for example, the irradiation with the ultraviolet light by an ultraviolet lamp 41 with respect to a range 31, on the recording medium 2, on which the active energy beam-curable ink has been printed, as shown in FIG. 2. FIG. 3 schematically shows a case that the discharge of the ink by the ink jet head and the irradiation with the ultraviolet light are performed continuously. In this case, an active energy beam-curable ink 53, which is discharged and adhered onto the recording medium 2 by an ink jet head 51, is transported to a position just under or below an ultraviolet lamp 52 by an unillustrated transport device; and the active energy beam-curable ink 53 is irradiated with the ultraviolet light under a predetermined irradiation condition, and the ink 53 is cured. The irradiation was performed by using one metal halide lamp (output: 80 W). A lamp filter was provided so that the lamp intensity was ⅓, and the transport velocity of the printing medium was 4.6 m/minute for each of the inks (colorless inks) shown in Table 1. The irradiation was performed for each of the inks (inks containing the coloring agent) shown in Table 2 under a condition in which the lamp intensity was restored to the original intensity, and the transport velocity of the printing medium was 4 m/minute. The test was carried out in an environment in which the room temperature was 25° C. and the humidity was 70%.

Evaluation

The recording medium, which was subjected to the printing with the ink, was evaluated in relation to the following items:

Viscosity

The viscosity was measured with a Brookfield viscometer DV-II+ while adjusting the number of revolutions so that the rotational torque was 20 to 30% in an environment of a temperature of 25° C. with a sample amount of 16 ml by using a cylindrical spindle.

Hardness

The hardness was evaluated by the pencil hardness test (JIS K5600-5-4).

+: Hardness was not less than 3H.
±: Hardness was H to 2H.
−: Hardness was not more than F.

Adhesion

The adhesion or adhesion degree was evaluated by the cross-cut test (JIS K5400)

+: All of 100 pieces were adhered.
±: At least one piece or more pieces was/were peeled off or exfoliated.
−: All of 100 pieces were peeled off or exfoliated.

Ink-Jet Discharge Stability

The discharge situation from the ink-jet head was visually judged based on the printing situation on the recording medium.

+: Ink was stably discharged.
±: Ink was unstably discharged, for example, such that the landing position was deviated.
−: Ink was not discharged.

The foregoing evaluation results were shown in Tables 1 and 2. Each of the active energy beam-curable inks of Examples 1 to 5 and Examples 6 and 7 was the active energy beam-curable ink containing, as the active energy beam-curable resin, the multifunctional epoxy compound, the oxetane compound, the monofunctional alicyclic epoxy compound, and the photocation polymerization initiator, wherein the content of the monofunctional alicyclic epoxy compound was 33 to 55% by weight. Accordingly, the viscosity was not more than 10 cps which was appropriately suitable for the ink jet recording system. Further, the printed matter, which had the high hardness and the high adhesion, was successfully obtained.

On the other hand, in Comparative Examples 1, 2, 9, and 11, the content of the monofunctional alicyclic epoxy compound was not more than 33% by weight. Therefore, the viscosity was not sufficiently lowered. The inks were not stably discharged from the ink jet head.

In Comparative Examples 3, 4, and 12, the content of the monofunctional alicyclic epoxy compound was large, i.e., not less than 55% by weight. Therefore, the contents of the multifunctional epoxy compound and the oxetane compound were relatively decreased. As a result, any sufficient hardness and any sufficient adhesion were not obtained.

In Comparative Examples 5 and 6, vinyl ether was used instead of using the monofunctional alicyclic epoxy compound. However, any sufficient adhesion was not obtained.

In Comparative Examples 7 and 8, the monofunctional aliphatic epoxy compound, which had the low viscosity, was used instead of using the monofunctional alicyclic epoxy compound. Although the viscosity was successfully lowered sufficiently, any sufficient adhesion was not obtained.

In Comparative Example 10, the viscosity was successfully lowered sufficiently even when the monofunctional alicyclic epoxy compound was not used. However, the hardness of the multifunctional epoxy compound was insufficient. The hardness was unsatisfactory after the curing.

Although the invention has been specifically explained exemplified by the Examples, the invention is not limited to the Examples. The pigment was used as the coloring agent in the Examples. However, it is allowable to use a dye instead of the pigment. Alternatively, the pigment and dye may be used together. In the Examples, the specific photocation polymerization initiator, multifunctional epoxy compound, oxetane compound and monofunctional alicyclic epoxy compound were used. However, the photocation polymerization initiator, the multifunctional epoxy compound, the oxetane compound and the monofunctional alicyclic epoxy compound are not limited to those used in the above-described Examples; and it is possible to use various kinds of substances exemplified in this specification as the photocation polymerization initiator, the multifunctional epoxy compound, the oxetane compound and the monofunctional alicyclic epoxy compound. As for the ink-jet recording system, the ink jet head and the ink jet recording apparatus, it is possible to use those other than the ink jet recording system, the ink-jet head and the ink-jet recording apparatus described in the Examples. For example, it is allowable to adopt such ink-jet recording apparatus and ink jet recording method as described in the U.S. Pat. No. 6,866,376. It is allowable to use, in the active energy beam-curable ink of the present invention, such oxetane compound, photocation polymerization initiator and other additive(s) as described in the U.S. Pat. No. 6,866,376. The disclosure of the U.S. Pat. No. 6,866,376 is incorporated herein by reference.

What is claimed is:

1. An active energy beam-curable ink comprising:
   a photocation polymerization initiator; and
   a multifunctional epoxy compound, an oxetane compound, and a monofunctional alicyclic epoxy compound as an active energy beam-curable resin;
   wherein a content of the monofunctional alicyclic epoxy compound is 33 to 55% by weight; and
   wherein the multifunctional epoxy compound is multifunctional alicyclic epoxy compound.

2. The active energy beam-curable ink according to claim 1, wherein the monofunctional alicyclic epoxy compound is 4-vinylepoxycyclohexane.

3. The active energy beam-curable ink according to claim 1, wherein the multifunctional epoxy compound is 3,4-epoxycyclohexylmethyl-3,4-epoxycyclohexane carboxylate or trimethylolpropane polyglycidyl ether.

4. The active energy beam-curable ink according to claim 1, wherein the monofunctional alicyclic epoxy compound has a viscosity of not more than 5 cps.

5. The active energy beam-curable ink according to claim 1, wherein the active energy beam-curable ink has a viscosity of not more than 10 cps.

6. The active energy beam-curable ink according to claim 1, further comprising, as a coloring agent, at least one of a dye and a pigment.

7. An ink jet recording method comprising:
   discharging the active energy beam-curable ink as defined in claim 1 to a recording medium; and
   irradiating the discharged active energy beam-curable ink with an active energy beam to cure the active energy beam-curable ink.

8. The inkjet recording method according to claim 7, wherein an inkjet head is used to discharge the active energy beam-curable ink to the recording medium.

9. The ink-jet recording method according to claim 8, wherein the cured active energy beam-curable ink has a hardness of not less than 3H as evaluated by a pencil hardness test.

10. The ink-jet recording method according to claim 8, wherein the cured active energy beam-curable ink has an adhesion degree that all 100 pieces are adhered as evaluated by a cross-cut test.

11. The active energy beam-curable ink according to claim 1, wherein a content of the multifunctional alicyclic epoxy compound is 33 to 44% by weight.

* * * * *